United States Patent
He et al.

(10) Patent No.: US 11,579,201 B2
(45) Date of Patent: Feb. 14, 2023

(54) METHOD AND SYSTEM FOR IDENTIFYING THIRD-ORDER MODEL PARAMETERS OF LITHIUM BATTERY BASED ON LIKELIHOOD FUNCTION

(71) Applicant: WUHAN UNIVERSITY, Hubei (CN)

(72) Inventors: Yigang He, Hubei (CN); Yuan Chen, Hubei (CN); Zhong Li, Hubei (CN); Guolong Shi, Hubei (CN); Liulu He, Hubei (CN); Chaolong Zhang, Hubei (CN)

(73) Assignee: WUHAN UNIVERSITY, Hubei (CN)

(*) Notice: Subject to any disclaimer, the term of this patent is extended or adjusted under 35 U.S.C. 154(b) by 193 days.

(21) Appl. No.: 17/092,329

(22) Filed: Nov. 9, 2020

(65) Prior Publication Data
US 2021/0325467 A1      Oct. 21, 2021

(30) Foreign Application Priority Data
Apr. 17, 2020  (CN) .......................... 202010303412.8

(51) Int. Cl.
*G01R 31/367* (2019.01)
*G01R 31/36* (2020.01)
*H02J 7/00* (2006.01)

(52) U.S. Cl.
CPC ....... *G01R 31/367* (2019.01); *G01R 31/3648* (2013.01); *H02J 7/0047* (2013.01)

(58) Field of Classification Search
CPC .......................... G01R 31/367; G01R 31/3648
USPC .......................................................... 702/63
See application file for complete search history.

(56) References Cited

U.S. PATENT DOCUMENTS

| 10,666,076 | B1* | 5/2020 | Kohn | .................. G01R 31/367 |
| 2017/0190262 | A1* | 7/2017 | Jin | ........................ H01M 10/44 |

FOREIGN PATENT DOCUMENTS

WO    WO-2013016188 A1 * 1/2013 ......... G01R 31/3651

* cited by examiner

*Primary Examiner* — Ricky Go
(74) *Attorney, Agent, or Firm* — JCIPRNET

(57) ABSTRACT

A method and a system for identifying third-order model parameters of a lithium battery based on a likelihood function are provided, which relates to a method for estimating battery model parameters of a lithium battery under different temperatures, different system-on-chips (SOCs), and charge-discharge currents. The method includes the following steps. A third-order battery model of the lithium battery is established. A battery model output voltage $U_d$ and a total battery current I under different temperatures, different SOCs, and charge-discharge currents are collected. The likelihood function is adopted to construct an identification model, and the collected data is substituted into the identification model to calculate the battery model parameters. Identified parameters are substituted into the third-order battery model to obtain a battery terminal voltage to be compared with a measured terminal voltage. The operation method of the disclosure is simple and effective, and can accurately estimate internal resistance parameters of the lithium battery.

8 Claims, 10 Drawing Sheets

METHOD AND SYSTEM FOR IDENTIFYING THIRD-ORDER MODEL PARAMETERS OF LITHIUM BATTERY BASED ON LIKELIHOOD FUNCTION

CROSS-REFERENCE TO RELATED APPLICATION

This application claims the priority benefit of China application serial no. 202010303412.8, filed on Apr. 17, 2020. The entirety of the above-mentioned patent application is hereby incorporated by reference herein and made a part of this specification.

BACKGROUND

Technical Field

The disclosure relates to the field of battery performance management, and more particularly relates to a method and a system for identifying third-order model parameters of a lithium battery based on a likelihood function.

Description of Related Art

Lithium-ion battery has the advantages such as long cycle life, good high-temperature performance, good stability, and moderate price, so as to become the first choice for new energy vehicle power battery. The current models of lithium-ion battery mainly include the electrochemical model, equivalent circuit model, and black box model.

The equivalent circuit model adopts a linear variable parameter modeling method, which uses ideal circuit elements such as a resistance, a capacitor and a controllable voltage source to simulate the working characteristics of the battery. The equivalent circuit model has the advantages such as simple structure, fewer parameters, and higher precision. The principle is clear to more accurately reflect the dynamic and static performance of the battery, is easy to implement in real-time system, and is convenient for system on a chip (SOC) estimation of the battery. The equivalent circuit model is the most researched and applied model currently. The higher the order of the battery model, the closer the battery model is to the actual model, but the model structure will be more complex. Through analyzing different equivalent circuit structures, it can be obtained that the error of external characteristics between the third-order to fifth-order batteries does not differ much, and considering the complexity and accuracy, the third-order equivalent circuit model is selected.

The maximum likelihood estimation is one of the most commonly used parameter estimation methods in mathematical statistics. Least squares estimation considers the estimation problem from the perspective of a fixed sample, but there is a problem of data saturation due to the increase of data. The maximum likelihood estimation considers the estimation problem from the perspective of a large sample. The maximum likelihood estimation is an application of probability theory in statistics: knowing that a certain parameter can maximize the probability of the sample, other samples with small probability will, of course, not be selected, so the parameter is used as the estimated true value. Choosing the maximum likelihood function under the condition of a large sample has good practical performance.

SUMMARY

The disclosure provides a method and a system for identifying third-order model parameters of a lithium battery based on a likelihood function, which establishes an identification model through collecting data of a battery model output voltage $U_d$ and a total battery current I under different temperatures, different system-on-chips (SOCs), and charge-discharge currents, and applying the maximum likelihood estimation based on the data to identify relevant parameters of the lithium battery.

To achieve the above objective, according to an aspect of the disclosure, a method for identifying third-order model parameters of a lithium battery based on a likelihood function is provided, which includes the following steps.

(1) A third-order battery model of a lithium battery is established.

(2) An output voltage and a total battery current of the third-order battery model under different temperatures, different SOCs, and charge-discharge currents are collected.

(3) A likelihood function is adopted to construct an identification model.

(4) The collected output voltage and total battery current of the third-order battery model are substituted into the identification model to calculate third-order battery model parameters.

Preferably, the third-order battery model includes a battery OCV, an ohmic resistor $R_{ac}$, a charge transfer resistor $R_{ct}$, a charge transfer capacitor $C_{ct}$, a first diffused resistor $R_{wb1}$, a first diffused capacitor $C_{wb1}$, a second diffused resistor $R_{wb2}$, and a second diffused capacitor $C_{wb2}$.

A first terminal of the battery OCV is connected to a first terminal of the ohmic resistor $R_{ac}$. A second terminal of the ohmic resistor $R_{ac}$ is connected to a first terminal of the charge transfer resistor $R_{ct}$ and a first terminal of the charge transfer capacitor $C_{ct}$. After being connected, a second terminal of the charge transfer resistor $R_{ct}$ and a second terminal of the charge transfer capacitor $C_{ct}$ are connected to a first terminal of the first diffused resistor $R_{wb1}$ and a first terminal of the first diffused capacitor $C_{wb1}$. After being connected, a second terminal of the first diffused resistor $R_{wb1}$ and a second terminal of the first diffused capacitor $C_{wb1}$ are connected to a first terminal of the second diffused resistor $R_{wb2}$ and a first terminal of the second diffused capacitor $C_{wb2}$. After being connected, a second terminal of the second diffused resistor $R_{wb2}$ and a second terminal of the second diffused capacitor $C_{wb2}$ are connected to a second terminal of the battery OCV.

Preferably, Step (1) includes the following.

A discretized battery state equation of the third-order battery model is:

$$\begin{cases} U_{ct}(k+1) = U_{ct}(k)*\exp(-T/\tau_{ct}) + I(k)R_{ct}*(1-\exp(-T/\tau_{ct})) \\ U_{wb1}(k+1) = U_{wb1}(k)*\exp(-T/\tau_{wb1}) + I(k)R_{wb1}*(1-\exp(-T/\tau_{wb1})) \\ U_{wb2}(k+1) = U_{wb2}(k)*\exp(-T/\tau_{wb2}) + I(k)R_{wb2}*(1-\exp(-T/\tau_{wb2})) \\ SOC(k+1) = SOC(k) - \dfrac{T*I(k)}{C} \end{cases}$$

where T is the sampling interval, k is the sampling time, I represents the total battery current, $U_{ct}$ represents the voltage of $R_{ct}C_{ct}$ network, $\tau_{ct}$ represents the time constant of $R_{ct}C_{ct}$ network, $U_{wb1}$ represents the voltage of $R_{wb1}C_{wb1}$ network, $\tau_{wb1}$ represents the time constant of $R_{wb1}C_{wb1}$ network, $U_{wb2}$ represents the voltage of $R_{wb2}C_{wb2}$ network, $\tau_{wb2}$ represents the time constant of $R_{wb2}C_{wb2}$ network, SOC represents the battery state of charge, C represents the battery capacity, and $R_{wb1}=3R_{wb2}$ and $\Sigma_{wb1}=3\tau_{wb2}$.

A discretized predicted battery module terminal voltage of the third-order battery model is:

$$y_{k+1}=U_{ocv}-U_{ct}(k)-U_{wb1}(k)-U_{wb2}(k)-R_{ac}I(k)$$

where $y_{k+1}$ represents the predicted battery module terminal voltage, $U_{ocv}$ represents the battery open circuit voltage, and $R_{ac}$ represents the ohmic internal resistance.

Preferably, Step (3) includes the following.

(3.1) After performing a Z-transformation on the battery state equation and the predicted battery module terminal voltage, an inverse Z-transformation is performed to obtain:

$$U_d(k+3)=\theta_1 U_d(k+2)+\theta_2 U_d(k+1)+\theta_3 U_d(k)+\theta_4 I(k+3)+$$
$$\theta_5(k+2)+\theta_6(k+1)+\theta_7 I(k) \text{ and } U_d(k)=(y_k-U_{OCV}).$$

(3.2) The identification model is obtained from $y_k=\theta^T\varphi(k)$, where $y_k$ is the predicted battery module terminal voltage, where: $\theta=[\theta_1\ \theta_2\ \theta_3\ \theta_4\ \theta_5\ \theta_6\ \theta_7]$, $\varphi(k)=U_d(k)=[U_d(k-1)\ U_d(k-2)\ U_d(k-3)\ I(k)\ I(k-1)\ I(k-2)\ I(k-3)]$, $\theta_1=b_1+b_3+b_5$, $\theta_2=-(b_1b_3+b_1b_5+b_3b_5)$, $\theta_3=b_1b_3b_5$, $\theta_4=-R_{ac}$, $\theta_5=R_{ac}(b_1+b_3+b_5)-(b_2+b_4+b_6)$, $\theta_6=(b_3+b_5)b_2+(b_1+b_5)b_4+(b_1+b_3)b_6-R_{ac}(b_1b_3+b_1b_5+b_3b_5)$, $\theta_7=b_1b_3b_5R_{ac}-b_3b_5b_2-b_1b_4b_5-b_1b_3b_6$, $b_1=\exp(-T/\tau_{ct})$, $b_2=R_{ct}*(1-\exp(-T/\tau_{ct}))$, $b_3=\exp(-T/\tau_{wb1})$, $b_4=R_{wb1}*(1-\exp(-T/\tau_{wb1}))$, and $b_5=\exp(-T/\tau_{wb2})$.

Preferably, Step (4) includes the following.

(4.1) A logarithm of a distribution function of the battery module terminal voltage is taken to obtain:

$$\ln L(\theta) = \frac{-1}{2\sigma^2}\sum_{k=1}^{n}(y(k)-\theta^T\varphi(k))^2 - n\ln\sigma\sqrt{2\pi},$$

where n represents the total sample number of the collected output voltage and total battery current of the battery model, σ represents the variance, where y(k) is the actual measured battery module terminal voltage, and $\omega(k)=U_d(k)=(y_k-U_{OCV})$.

(4.2) A gradient operator is set as $$\nabla_\theta = \left[\frac{\partial}{\partial\theta_1}\ \frac{\partial}{\partial\theta_2}\ \frac{\partial}{\partial\theta_3}\ \frac{\partial}{\partial\theta_4}\ \frac{\partial}{\partial\theta_5}\ \frac{\partial}{\partial\theta_6}\ \frac{\partial}{\partial\theta_7}\right].$$

The collected output voltage and total battery current of the third-order battery model are substituted into the equation in Step (4.1), and $$\nabla_\theta \ln L(\theta) = \frac{-1}{\sigma^2}\sum_{k=1}^{n}(y(k)-\theta^T\varphi(k))^2(-\varphi(k))=0$$

to calculate each element value of a matrix $\theta=[\theta_1\ \theta_2\ \theta_3\ \theta_4\ \theta_5\ \theta_6\ \theta_7]$.

(4.3) A magnitude of a third-order battery model parameter value is inferred according to a relationship between the third-order battery model parameter value and θ.

According to another aspect of the disclosure, a system for identifying third-order model parameters of a lithium battery based on a likelihood function is provided, which includes the following.

A battery model construction module is configured to establish a third-order battery model of a lithium battery.

A data collection module is configured to collect an output voltage and a total battery current of the third-order battery model under different temperatures, different SOCs, and charge-discharge currents.

An identification model construction module is configured to adopt a likelihood function to construct an identification model.

A parameter determination module is configured to substitute the collected output voltage and total battery current of the third-order battery model into the identification model to calculate third-order battery model parameters.

Preferably, the third-order battery model includes a battery OCV, an ohmic resistor $R_{ac}$, a charge transfer resistor $R_{ct}$, a charge transfer capacitor $C_{ct}$, a first diffused resistor $R_{wb1}$, a first diffused capacitor $C_{wb1}$, a second diffused resistor $R_{wb2}$, and a second diffused capacitor $C_{wb2}$.

A first terminal of the battery OCV is connected to a first terminal of the ohmic resistor $R_{ac}$. A second terminal of the ohmic resistor $R_{ac}$ is connected to a first terminal of the charge transfer resistor $R_{ct}$ and a first terminal of the charge transfer capacitor $C_{ct}$. After being connected, a second terminal of the charge transfer resistor $R_{ct}$ and a second terminal of the charge transfer capacitor $C_{ct}$ are connected to a first terminal of the first diffused resistor $R_{wb1}$ and a first terminal of the first diffused capacitor $C_{wb1}$. After being connected, a second terminal of the first diffused resistor $R_{wb1}$ and a second terminal of the first diffused capacitor $C_{wb1}$ are connected to a first terminal of the second diffused resistor $R_{wb2}$ and a first terminal of the second diffused capacitor $C_{wb2}$. After being connected, a second terminal of the second diffused resistor $R_{wb2}$ and a second terminal of the second diffused capacitor $C_{wb2}$ are connected to a second terminal of the battery OCV.

Preferably, the battery model construction module includes the following.

A battery state equation establishment module is configured to establish a discretized battery state equation of the third-order battery model, which is:

$$\begin{cases} U_{ct}(k+1) = U_{ct}(k)*\exp(-T/\tau_{ct}) + I(k)R_{ct}*(1-\exp(-T/\tau_{ct})) \\ U_{wb1}(k+1) = U_{wb1}(k)*\exp(-T/\tau_{wb1}) + I(k)R_{wb1}*(1-\exp(-T/\tau_{wb1})) \\ U_{wb2}(k+1) = U_{wb2}(k)*\exp(-T/\tau_{wb2}) + I(k)R_{wb2}*(1-\exp(-T/\tau_{wb2})) \\ SOC(k+1) = SOC(k) - \frac{T*I(k)}{C} \end{cases}$$

where T is the sampling interval, k is the sampling time, I represents the total battery current, $U_{ct}$ represents the voltage of $R_{ct}C_{ct}$ network, $\tau_{ct}$ represents the time constant of $R_{ct}C_{ct}$ network, $U_{wb1}$ represents the voltage of $R_{wb1}C_{wb1}$ network, $\tau_{wb1}$ represents the time constant of $R_{wb1}C_{wb1}$ network, $U_{wb2}$ represents the voltage of $R_{wb2}C_{wb2}$ network, $\tau_{wb2}$ represents the time constant of $R_{wb2}C_{wb2}$ network, SOC represents the battery state of charge, C represents the battery capacity, and $R_{wb1}=3R_{wb2}$ and $\tau_{wb1}=3\tau_{wb2}$.

A battery module terminal voltage acquisition module is configured to acquire a discretized predicted battery model terminal voltage of the third-order battery model, which is:

$$y_{k+1}=U_{ocv}-U_{ct}(k)-U_{wb1}(k)-U_{wb2}(k)-R_{ac}I(k)$$

where $y_{k+1}$ represents the predicted battery module terminal voltage, $U_{ocv}$ represents the battery open circuit voltage, and $R_{ac}$ represents the ohmic internal resistance.

Preferably, the identification model construction module includes the following.

A transformation module is configured to perform an inverse Z-transformation after performing a Z-transformation on the battery state equation and the predicted battery module terminal voltage, so as to obtain:

$$U_d(k+3)=\theta_1 U_d(k+2)+\theta_2 U_d(k+1)+\theta_3 U_d(k)+\theta_4 I(k+3)+\theta_5(k+2)+\theta_6(k+1)+\theta_7 I(k) \text{ and } U_d(k)=(y_k-U_{OCV}).$$

An identification model construction submodule is configured to obtain the identification model from $y_k=\theta^T\varphi(k)$, where $y_k$ is the predicted battery module terminal voltage, where: $\theta=[\theta_1\ \theta_2\ \theta_3\ \theta_4\ \theta_5\ \theta_6\ \theta_7]$ $\varphi(k)=U_d(k)=[U_d(k-1)\ U_d(k-2)\ U_d(k-3)\ I(k)\ I(k-1)\ I(k-2)\ I(k-3)]$, $\theta_1=b_1+b_3+b_5$, $\theta_2=-(b_1b_3+b_1b_5+b_3b_5)$, $\theta_3=b_1b_3b_5$, $\theta_4=-R_{ac}$, $\theta_5=R_{ac}(b_1+b_3+b_5)-(b_2+b_4+b_6)$, $\theta_6=(b_3+b_5)b_2+(b_1+b_5)b_4+(b_1+b_3)b_6-R_{ac}(b_1b_3+b_1b_5+b_3b_5)$, $\theta_7=b_1b_3b_5R_{ac}-b_3b_5b_2-b_1b_4b_5-b_1b_3b_6$, $b_1=\exp(-T/\tau_{ct})$, $b_2=R_{ct}*(1-\exp(-T/\tau_{ct}))$, $b_3=\exp(-T/\tau_{wb1})$, $b_4=R_{wb1}*(1-\exp(-T/\tau_{wb1}))$, and $b_5=\exp(-T/\tau_{wb2})$.

Preferably, the parameter determination module includes the following.

A first calculation module is configured to take a logarithm of a distribution function of the battery module terminal voltage, so as to obtain:

$$\ln L(\theta) = \frac{-1}{2\sigma^2}\sum_{k=1}^{n}(y(k)-\theta^T\varphi(k))^2 - n\ln\sigma\sqrt{2\pi},$$

where n represents the total sample number of the collected output voltage and total battery current of the battery model, σ represents the variance, where y(k) is the actual measured battery module terminal voltage, and $\varphi(k)=U_d(k)=(y_k-U_{OCV})$.

A second calculation module is configured to set a gradient operator as $$\nabla_\theta = \left[\begin{array}{ccccccc}\frac{\partial}{\partial\theta_1} & \frac{\partial}{\partial\theta_2} & \frac{\partial}{\partial\theta_3} & \frac{\partial}{\partial\theta_4} & \frac{\partial}{\partial\theta_5} & \frac{\partial}{\partial\theta_6} & \frac{\partial}{\partial\theta_7}\end{array}\right].$$

The collected output voltage and total battery current of the third-order battery model are substituted into the equation of the first calculation module, and $$\nabla_\theta \ln L(\theta) = \frac{-1}{\sigma^2}\sum_{k=1}^{n}(y(k)-\theta^T\varphi(k))^2(-\varphi(k)) = 0$$

to calculate each element value of a matrix $\theta=[\theta_1\ \theta_2\ \theta_3\ \theta_4\ \theta_5\ \theta_6\ \theta_7]$.

A parameter determination submodule is configured to infer a magnitude of a third-order battery model parameter value according to a relationship between the third-order battery model parameter value and θ.

In general, compared with the prior art, the above technical solutions conceived by the disclosure can achieve the following beneficial effects:

(1) Using the maximum likelihood function method to establish the identification model and applying the same to calculate the third-order model parameters of the lithium battery is provided for the first time. The processed data is more accurate, and the situations of different temperatures, different SOCs, and charge-discharge currents are considered.

(2) Adopting the maximum likelihood function for model parameter identification and performing load cycle condition verification of a hybrid electric vehicle at 70% SOC point may obtain the parameter value obtained by adopting the likelihood function for parameter estimation following the actual parameter value. The mean absolute error (MAE) for measuring the terminal voltage is less than 0.0084 V. The method is simpler and may solve the problem of data saturation of the least squares estimation due to the increase of data. The convergence is unbiased or asymptotically unbiased. When the number of samples increases, the convergence property is better.

BRIEF DESCRIPTION OF THE DRAWINGS

FIG. 2A is a charge-discharge current and FIG. 2B is an output terminal voltage.

FIG. 3A is the parameterized result of $R_{ac}$, FIG. 3B is the parameterized result of $R_{ct}$, FIG. 3C is the parameterized result of $R_{wb1}$, FIG. 3D is the parameterized result $C_{wb1}$, and FIG. 3E is the parameterized result of $C_{ct}$.

FIG. 4A is the parameter value at 35°, FIG. 4B is the parameter value at 20°, FIG. 4C is the parameter value at 0°, and FIG. 4D is the parameter value at −20°.

FIG. 5A is a load cycle condition input current, FIG. 5B is a comparison between a measured voltage and a simulated voltage, FIG. 5C is the comparison between the measured voltage and the simulated voltage in a certain region after amplification, and FIG. 5D is an absolute error of the simulated voltage.

DETAILED DESCRIPTION OF DISCLOSED EMBODIMENTS

In order for the objectives, technical solutions, and advantages of the disclosure to be clearer, the disclosure is further described in detail below with reference to the accompanying drawings and embodiments. It should be understood that the specific embodiments described herein only serve to explain the disclosure, but not to limit the disclosure. In addition, the technical features involved in the various embodiments of the disclosure described below may be combined with each other as long as there is no conflict therebetween.

In the example of the disclosure, terms such as "first" and "second" are used to distinguish different objects, and are not necessarily used to describe a specific order or sequence.

The disclosure provides a method and a system for identifying third-order model parameters of a lithium battery based on a likelihood function, which can accurately identify the parameters of the lithium battery under different temperatures, different SOCs, and charge-discharge currents.

Figure 1:
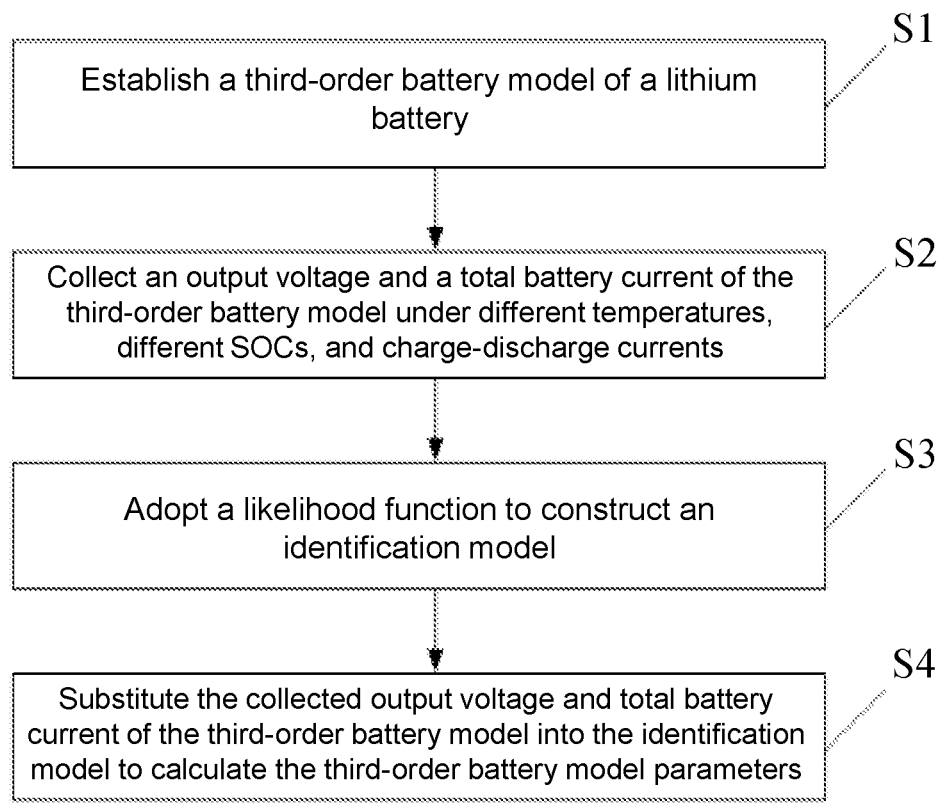
FIG. 1 is a schematic flowchart of a method for identifying third-order model parameters of a lithium battery based on a likelihood function according to an embodiment of the disclosure.

FIG. 1 is a schematic flowchart of a method for identifying third-order model parameters of a lithium battery based on a likelihood function according to an embodiment of the disclosure. Through establishing a third-order battery model of the lithium battery, a battery model output voltage $U_d$ and a total battery current I under different temperatures, different system-on-chips (SOCs), and charge-discharge currents are collected. Then, the likelihood function is adopted to construct an identification model. The collected data is substituted into the identification model to calculate the battery model parameters. The method includes the following steps.

Step S1: A third-order battery model of a lithium battery is established.

Step S2: A battery model output voltage $U_d$ and a total battery current I under different temperatures, different SOCs, and charge-discharge currents are collected.

Step S3: A likelihood function is adopted to construct an identification model.

Step S4: The collected data is substituted into the identification model to calculate battery model parameters.

In the embodiment of the disclosure, Step S1 includes the following step.

Figure 6:
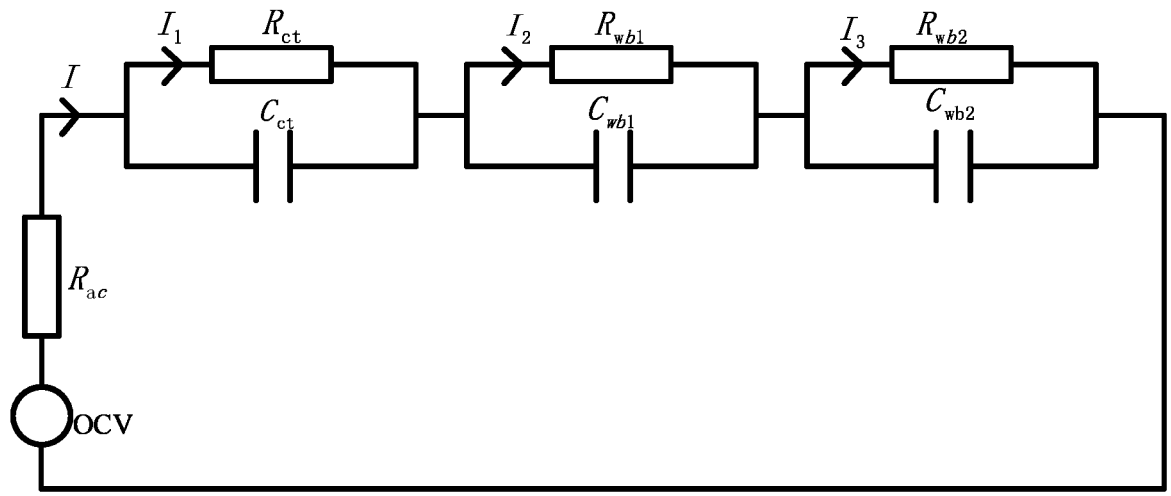
FIG. 6 is a third-order equivalent circuit model according to an embodiment of the disclosure.

The third-order battery model of the lithium battery is established as shown in FIG. 6, specifically as follows.

The third-order battery model of the lithium battery includes a battery OCV, an ohmic resistor $R_{ac}$, a charge transfer resistor $R_{ct}$, a charge transfer capacitor $C_{ct}$, a first diffused resistor $R_{wb1}$, a first diffused capacitor $C_{wb1}$, a second diffused resistor $R_{wb2}$, and a second diffused capacitor $C_{wb2}$.

A first terminal of the battery OCV is connected to a first terminal of the ohmic resistor $R_{ac}$. A second terminal of the ohmic resistor $R_{ac}$ is connected to a first terminal of the charge transfer resistor $R_{ct}$ and a first terminal of the charge transfer capacitor $C_{ct}$. After being connected, a second terminal of the charge transfer resistor $R_{ct}$ and a second terminal of the charge transfer capacitor $C_{ct}$ are connected to a first terminal of the first diffused resistor $R_{wb1}$ and a first terminal of the first diffused capacitor $C_{wb1}$. After being connected, a second terminal of the first diffused resistor $R_{wb1}$ and a second terminal of the first diffused capacitor $C_{wb1}$ are connected to a first terminal of the second diffused resistor $R_{wb2}$ and a first terminal of the second diffused capacitor $C_{wb2}$. After being connected, a second terminal of the second diffused resistor $R_{wb2}$ and a second terminal of the second diffused capacitor $C_{wb2}$ are connected to a second terminal of the battery OCV.

A discretized battery state equation is:

$$\begin{cases} U_{ct}(k+1) = U_{ct}(k)*\exp(-T/\tau_{ct}) + I(k)R_{ct}*(1-\exp(-T/\tau_{ct})) \\ U_{wb1}(k+1) = U_{wb1}(k)*\exp(-T/\tau_{wb1}) + I(k)R_{wb1}*(1-\exp(-T/\tau_{wb1})) \\ U_{wb2}(k+1) = U_{wb2}(k)*\exp(-T/\tau_{wb2}) + I(k)R_{wb2}*(1-\exp(-T/\tau_{wb2})) \\ SOC(k+1) = SOC(k) - \dfrac{T*I(k)}{C} \end{cases}$$

where T is the sampling interval, k is the sampling time, I represents the total battery current, $U_{ct}$ represents the voltage of $R_{ct}C_{ct}$ network, $\tau_{ct}$ represents the time constant of $R_{ct}C_{ct}$ network, $U_{wb1}$ represents the voltage of $R_{wb1}C_{wb1}$ network, $\tau_{wb1}$ represents the time constant of $R_{wb1}C_{wb1}$ network, $U_{wb2}$ represents the voltage of $R_{wb2}C_{wb2}$ network, $\tau_{wb2}$ represents the time constant of $R_{wb2}C_{wb2}$ network, SOC represents the battery state of charge, C represents the battery capacity, and $R_{wb1}=3R_{wb2}$ and $\tau_{wb1}=3\tau_{wb2}$.

A discretized predicted module model terminal voltage is:

$$y_{k+1}=U_{ocv}-U_{ct}(k)-U_{wb1}(k)-U_{wb2}(k)-R_{ac}I(k)$$

where $y_{k+1}$ represents the predicted battery module terminal voltage, $U_{ocv}$ represents the battery open circuit voltage, and $R_{ac}$ represents the ohmic internal resistance.

In the embodiment of the disclosure, Step S2 includes the following step.

The battery model output voltage $U_d$ and the total battery current I under different temperatures, different SOCs, and charge-discharge currents are collected. For example, the specific values that may be collected are temperature T=[−20 0 20 35], SOC=[10%, 20%, 30%, 40%, 50%, 60%, 70%, 80%, 90%], and charge-discharge current I=[−140, −40, 0, 20, 65] A.

In the embodiment of the disclosure, Step S3 includes the following steps.

The likelihood function is adopted to construct the identification model, specifically as follows.

Step S3.1: After performing a Z-transformation on the battery state equation and the predicted battery module terminal voltage obtained in Step S1, an inverse Z-transformation is performed to obtain:

$$U_d(k+3)=\theta_1 U_d(k+2)+\theta_2 U_d(k+1)+\theta_3 U_d(k)+\theta_4 I(k+3)+\theta_5 I(k+2)+\theta_6 I(k+1)+\theta_7 I(k), \text{ and } U_d(k)=(y_k-U_{OCV}).$$

Step S3.2: The predicted battery module terminal voltage is obtained: $y_k=\theta^T\varphi(k)$, where: $\theta=[\theta_1\ \theta_2\ \theta_3\ \theta_4\ \theta_5\ \theta_6\ \theta_7]$, $\varphi(k)=U_d(k)=[U_d(k-1)\ U_d(k-2)\ U_d(k-3)\ I(k)\ I(k-1)\ I(k-2)\ I(k-3)]$, and the corresponding relationship between the parameters is as follows: $\theta_1=b_1+b_3+b_5$, $\theta_2=-(b_1b_3+b_1b_5+b_3b_5)$, $\theta_3=b_1b_3b_5$, $\theta_4=-R_{ac}$, $\theta_5=R_{ac}(b_1+b_3+b_5)-(b_2+b_4+b_6)$, $\theta_6=b_3+b_5+(b_1+b_5)b_4+(b_1+b_3)b_6-R_{ac}(b_1b_3+b_1b_5+b_3b_5)$, $\theta_7=b_1b_3b_5R_{ac}-b_3b_5b_2-b_1b_4b_5-b_1b_3b_6$, $b_1=\exp(-T/\tau_{ct})$, $b_2=R_{ct}*(1-\exp(-T/\tau_{ct}))$, $b_3=\exp(-T/\tau_{wb1})$, $b_4=R_{wb1}*(1-\exp(-T/\tau_{wb1}))$, and $b_5=\exp(-T/\tau_{wb2})$.

In the embodiment of the disclosure, in Step S4, the collected data are the battery model output voltage $U_d$ and the total battery current I under different times. The battery model parameters that need to be calculated are: $R_{ac}$, $R_{ct}$, $R_{wb1}$, $C_{wb1}$, and $C_{ct}$. The specific calculation method is as follows.

Step S4.1: The identification model is $y_k=\theta^T\varphi(k)$, where $\varphi(k)=U_d(k)=(y_k-U_{OCV})$. $U_{OCV}$ is the open circuit voltage obtained from the experiment, and $y_k$ is the predicted battery module terminal voltage. Since the measurement error is normally distributed, the distribution function of $y_k$ satisfies the following equations:

$$f(x)=\frac{1}{\sqrt{2\pi}\sigma}e^{-\frac{(x-\mu)^2}{2\sigma^2}} \text{ and } L(\theta)=\prod_{k=1}^n f(x)=\prod_{k=1}^n \frac{1}{\sqrt{2\pi}\sigma}e^{-\frac{(x-\mu)^2}{2\sigma^2}}.$$

A logarithm of $L(\theta)$ is taken to obtain:

$$\ln L(\theta)=\frac{-1}{2\sigma^2}\sum_{k=1}^n (y(k)-\theta^T\varphi(k))^2 - n\ln\sigma\sqrt{2\pi} \qquad (1)$$

where n represents the total sample number of the collected battery model output voltage $U_d$ and the total battery current I, $\sigma$ represents the variance, and y(k) is the actual measured battery module terminal voltage.

Step 4.2: A gradient operator is set as $$\nabla_\theta = \left[ \begin{array}{ccccccc} \frac{\partial}{\partial \theta_1} & \frac{\partial}{\partial \theta_2} & \frac{\partial}{\partial \theta_3} & \frac{\partial}{\partial \theta_4} & \frac{\partial}{\partial \theta_5} & \frac{\partial}{\partial \theta_6} & \frac{\partial}{\partial \theta_7} \end{array} \right].$$

The collected data is substituted into Equation (1), and $$\nabla_\theta \ln L(\theta) = \frac{-1}{\sigma^2} \sum_{k=1}^{n} (y(k) - \theta^T \varphi(k))^2 (-\varphi(k)) = 0$$

to calculate each element value of a matrix $\theta = [\theta_1\ \theta_2\ \theta_3\ \theta_4\ \theta_5\ \theta_6\ \theta_7]$.

Step 4.3: A magnitude of a third-order battery model parameter value is inferred according to a relationship between the third-order battery model parameter value and $\theta$.

The likelihood function is a statistical method that considers the estimation problem from the perspective of a large sample. Let a population X be a discrete random variable, $\theta = (\theta_1, \theta_2, \ldots, \theta_k)$ be a multi-dimensional parameter vector, $X_1, X_2, \ldots X_n$ be the sample from X, $x_1, x_2, \ldots, x_n$ be the sample value, and the probability calculation equation be $P\{X_i = x_i\} = p(x_i; \theta_1, \ldots, \theta_k)$. Then, the likelihood function is as follows:

$$L(\theta) = L(x_1, x_2, \ldots, x_n; \theta_1, \theta_2, \ldots, \theta_7) = \prod_{i=1}^{n} p(x_i; \theta_1, \theta_2, \ldots, \theta_7).$$

In the case where the test results (that is, the samples) are known, $L(\theta)$ is used to estimate the parameters that satisfy the distribution of the samples, and the most likely parameters are used as the true parameter estimation.

Figure 7:
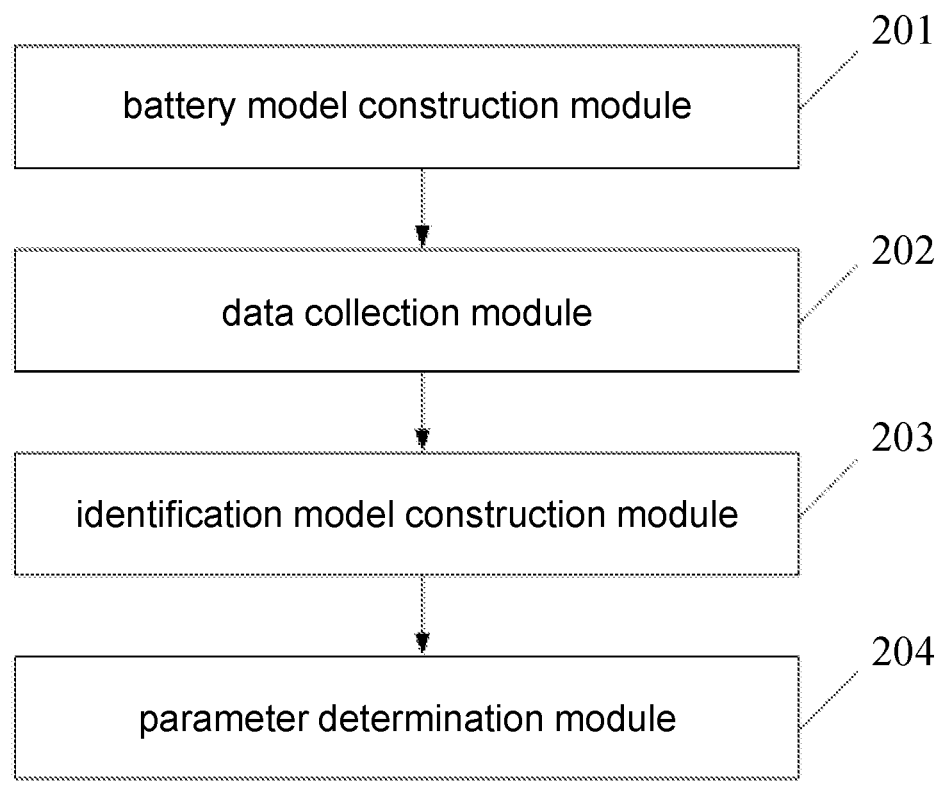
FIG. 7 is a block diagram of a system according to an embodiment of the disclosure.

As shown in FIG. 7, in another embodiment of the disclosure, a system for identifying third-order model parameters of a lithium battery based on a likelihood function is also provided, which includes the following.

A battery model construction module 201 is configured to establish a third-order battery model of a lithium battery.

A data collection module 202 is configured to collect an output voltage and a total battery current of the third-order battery model under different temperatures, different SOCs, and charge-discharge currents.

An identification model construction module 203 is configured to adopt a likelihood function to construct an identification model.

A parameter determination module 204 is configured to substitute the collected output voltage and total battery current of the third-order battery model into the identification model to calculate third-order battery model parameters.

For the specific implementation of each module, reference may be made to the descriptions of the foregoing embodiment of the method, which will not be reiterated.

In order to demonstrate the identification of the third-order model parameters of the lithium battery based on the likelihood function provided by the disclosure, an example is described here. A LR1865SV lithium battery provided by a certain company is used as an experimental object. Experimental data, battery charge-discharge system Arbin BT2000-5V500A, high and low temperature experimental box HL T402P, LR1865SV lithium battery nominal voltage 4.1 V, and nominal capacity 7.65 Ah, are collected through a battery test platform. Battery experimental data is collected. The temperature includes 4 temperature points of −20, 0, 20, and 35, which cover the temperature points traversed by the battery operation. The SOC value is 10%-90% and is collected every 10%. For the parameters of $R_{ac}$ that change with current, the charge-discharge current and the output terminal voltage under input currents of −140, −40, 0, 20, 65 are collected.

The disclosure will be further described below in conjunction with the drawings and implementation methods.

Figure 2A:
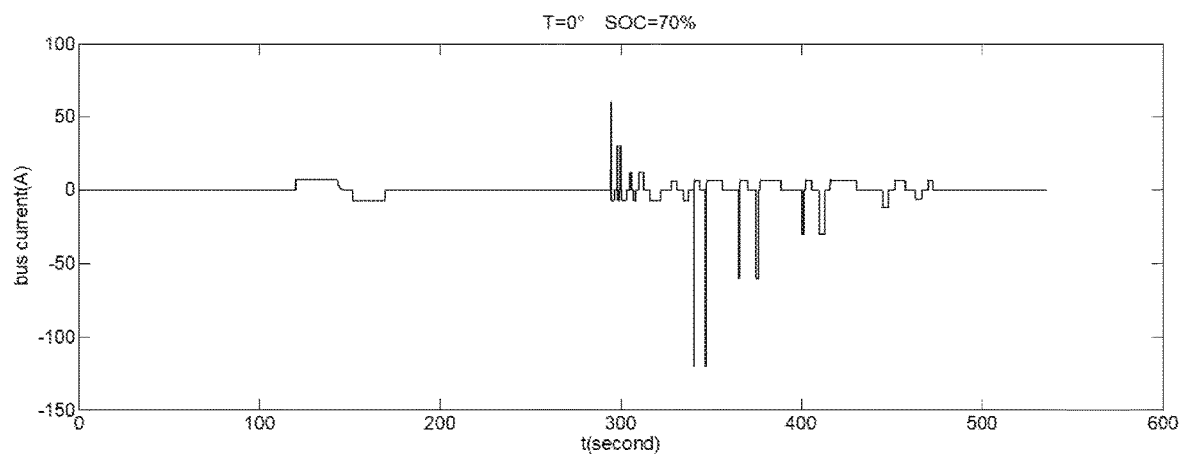
FIG. 2A to FIG. 2B is experimental data collected at 0° according to an embodiment of the disclosure, where
Figure 2B:
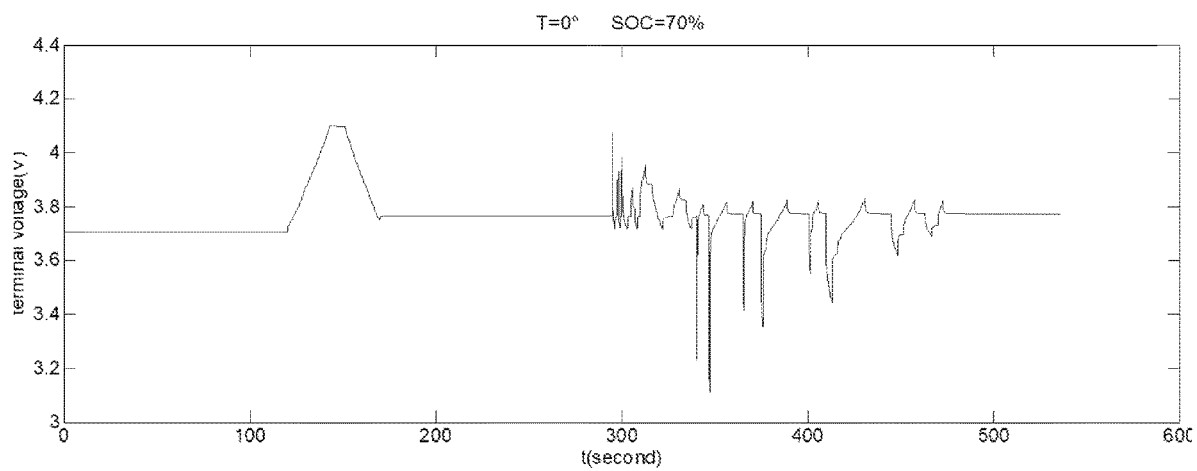

As shown in FIG. 2A to FIG. 2B, the method to measure and obtain the battery model output voltage $U_d$ and the total battery current I under different temperatures, different SOCs, and charge-discharge currents of the lithium battery is a composite pulse test, which include the following main test steps.

(1) Before the test, a standard constant current-constant voltage (CC-CV) charging method is used to fully charge a battery to 100%, and let the battery stand for about three hours to tend to a balanced state.

(2) A constant current (usually ⅓ C, where C is the battery nominal capacity value, and ⅓ C is 12 A of current) discharge is implemented on a power battery, so that the SOC thereof moves down to 90%. Let the power battery stand for about 1 hour. Then, a composite pulse excitation sequence (which is a customized sequence, as shown in FIG. 2A) is loaded. Here, the charge-discharge current is 1 C-3 C.

(3) The previous step is repeated to continuously move the SOC to 80%, 70%, until the SOC is 20%.

FIG. 2A to FIG. 2B shows part of the data collected at 0° and 70% SOC. In FIG. 2A is the charge-discharge current and FIG. 2B is the output terminal voltage.

Figure 3A:
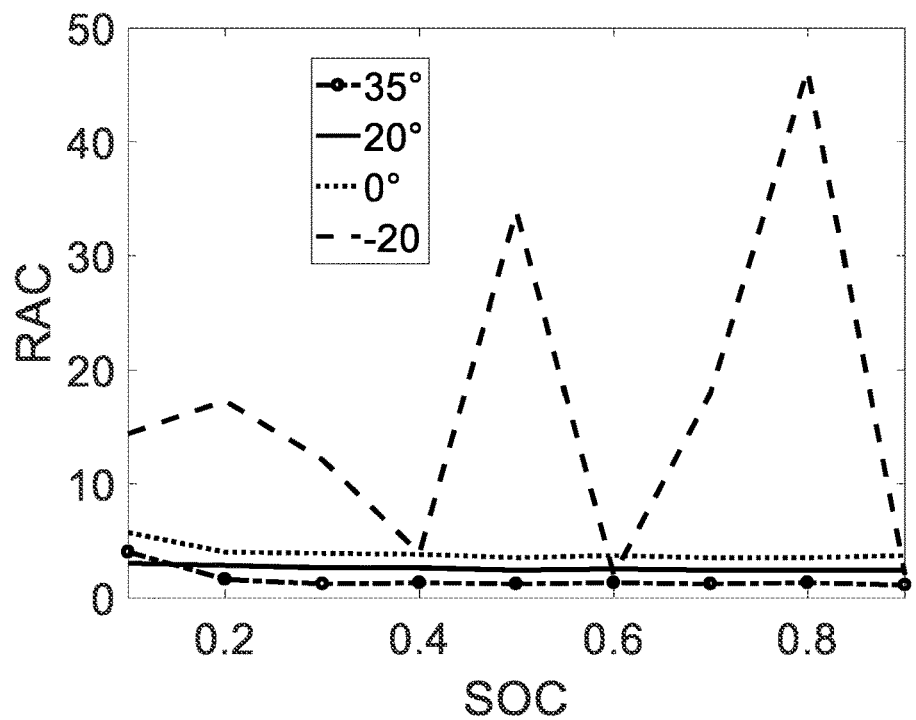
FIG. 3A to FIG. 3E is a parameterized result at 20A of charge-discharge current according to an embodiment of the disclosure, where
Figure 3B:
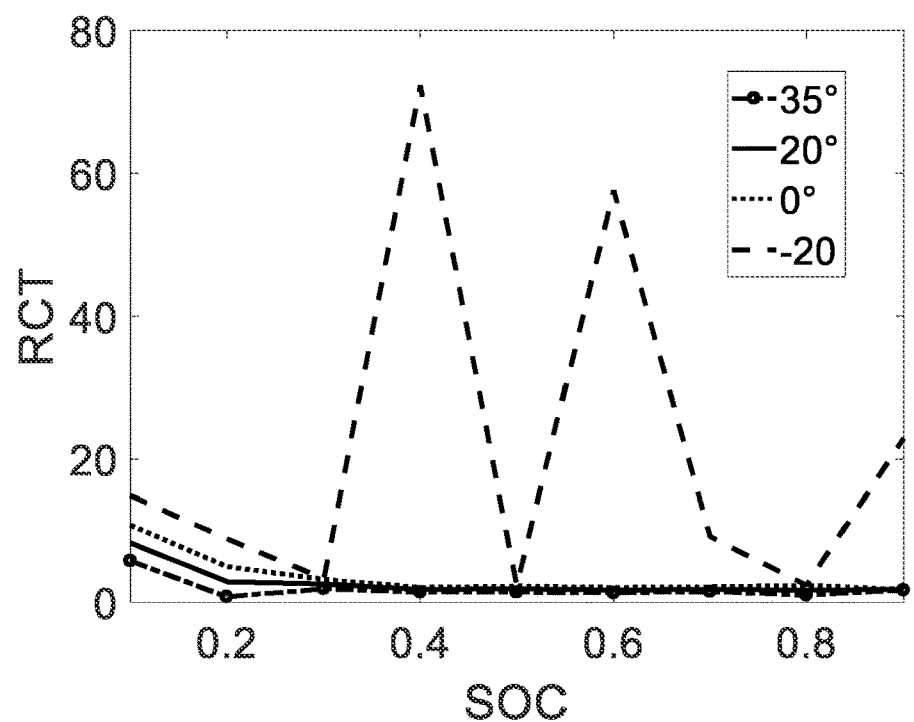
Figure 3C:
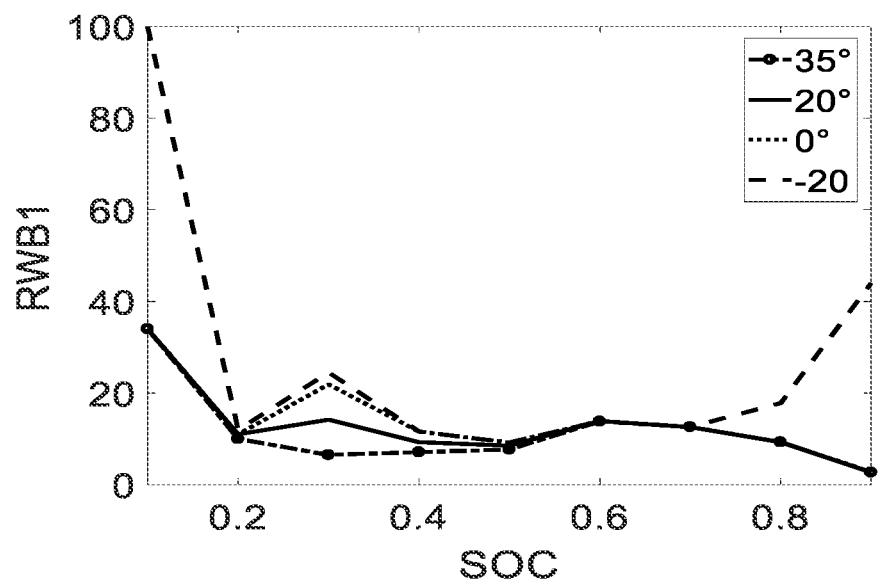
Figure 3D:
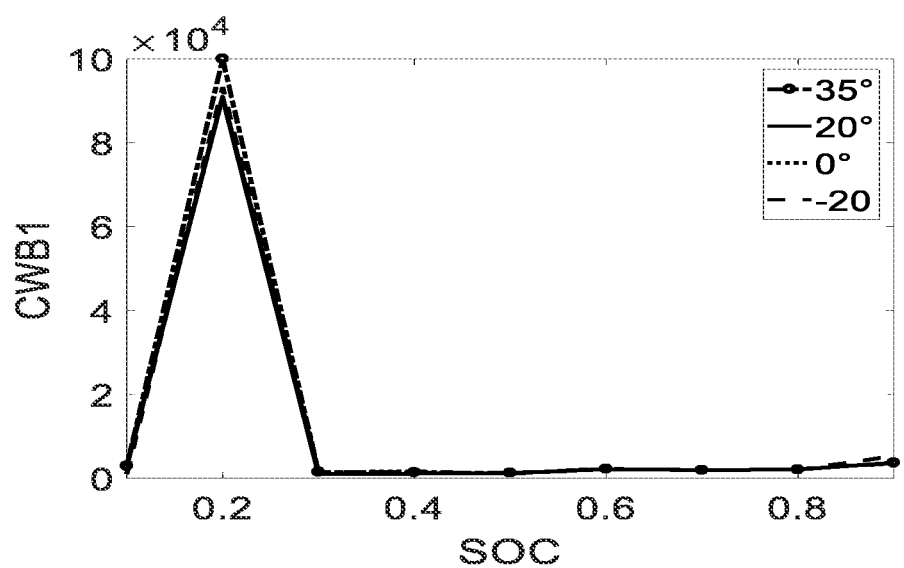
Figure 3E:
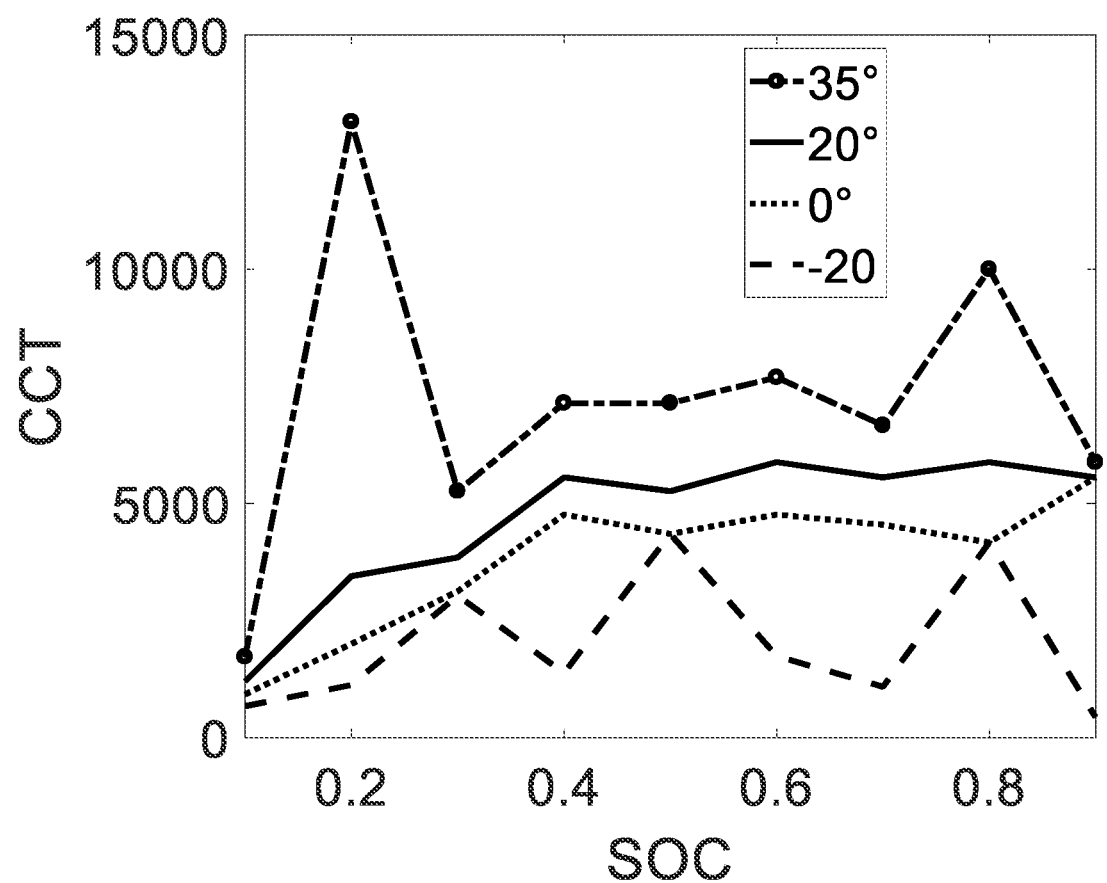
Figure 4A:
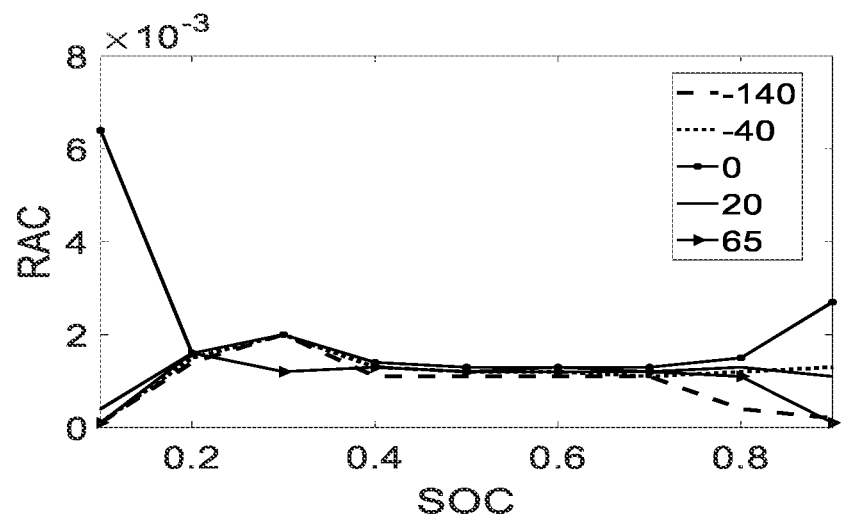
FIG. 4A to FIG. 4D is a parameter value of $R_{ac}$ under different charge-discharge currents under different temperatures according to an embodiment of the disclosure, where
Figure 4B:
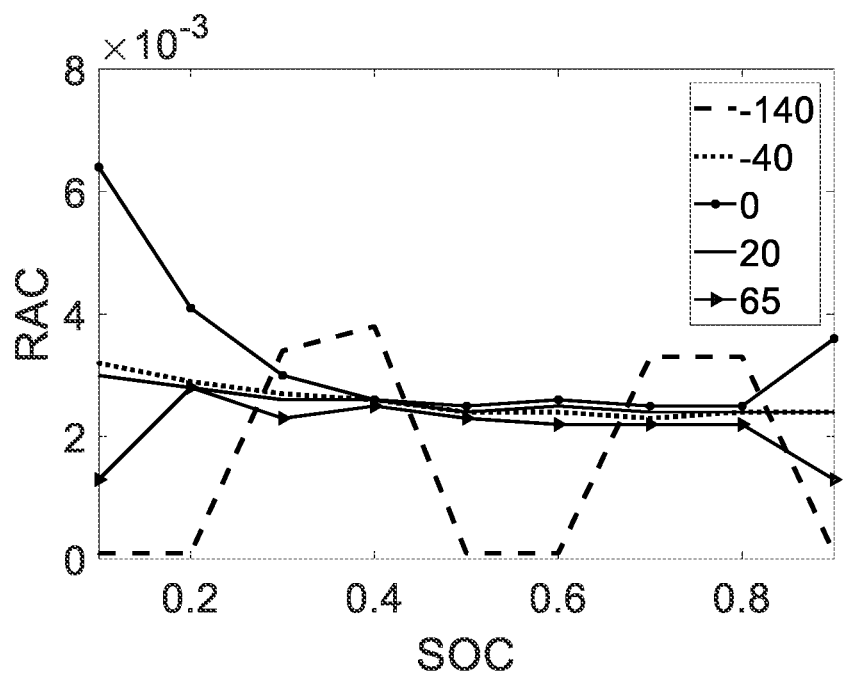
Figure 4C:
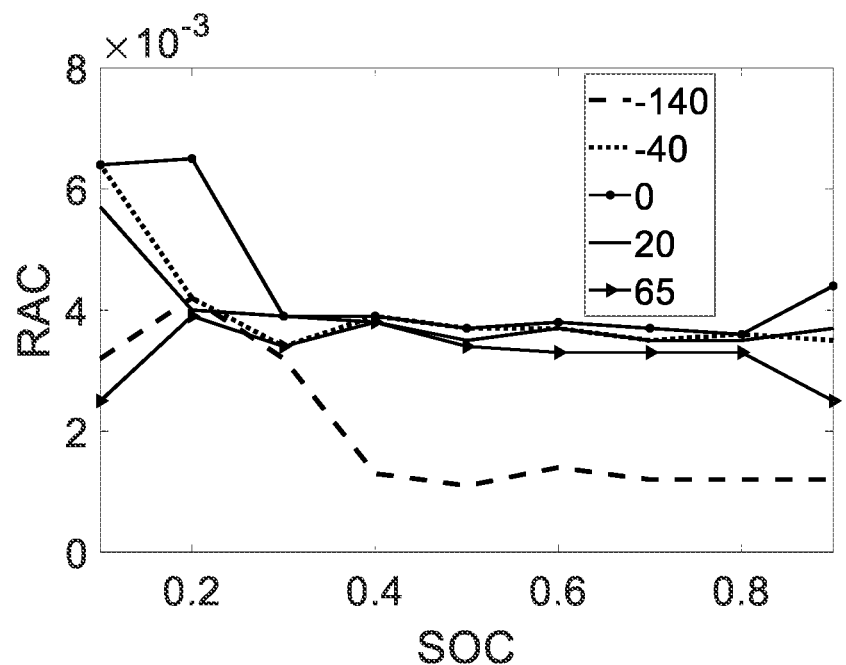
Figure 4D:
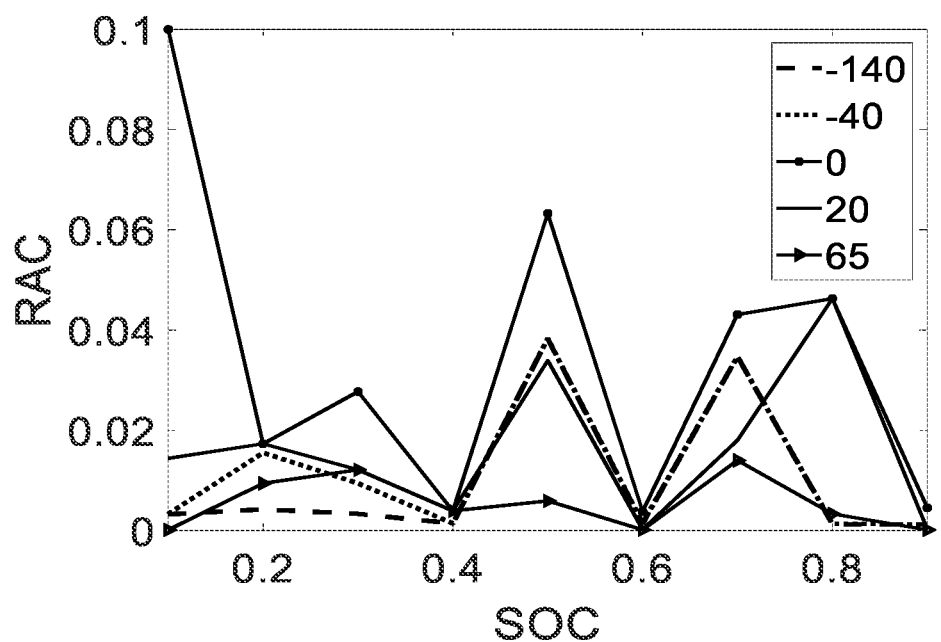

The parameters collected at a certain SOC point at a certain temperature are substituted into the model established by the likelihood function provided by the disclosure for calculation. The battery parameter value ((1) $R_{ac}$ (2) $R_{ct}$ (3) $R_{wb1}$ (4) $C_{wb1}$ (5) $C_{ct}$) at the SOC value at the temperature may be obtained. Battery parameter values at all SOC values at all temperatures are calculated and obtained, which are shown in a drawing according to the corresponding parameter values to obtain the parameterized results under different temperatures in FIG. 3A to FIG. 3E. In FIG. 3A is the parameterized result of $R_{ac}$, FIG. 3B is the parameterized result of $R_{ct}$, FIG. 3C is the parameterized result of $R_{wb1}$, FIG. 3D is the parameterized result $C_{wb1}$, and FIG. 3E is the parameterized result of $C_{ct}$. In the same way, the parameter values under different charge-discharge currents under different temperatures may be obtained in FIG. 4A to FIG. 4D. In FIG. 4A is the parameter value at 35°, FIG. 4B is the parameter value at 20°, FIG. 4C is the parameter value at 0°, and FIG. 4D is the parameter value at −20°.

Figure 5A:
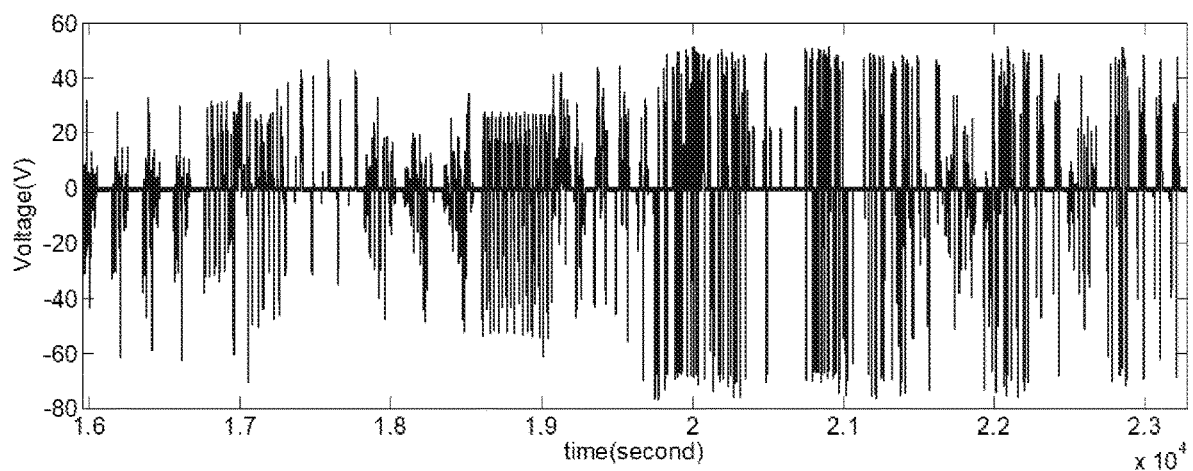
FIG. 5A to FIG. 5D is a parameterized verification result of a battery model according to an embodiment of the disclosure, where
Figure 5B:
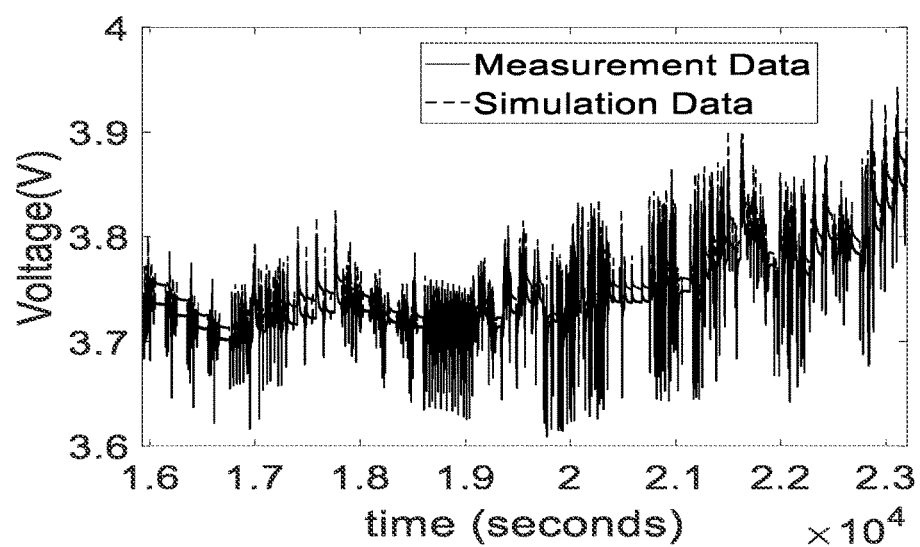
Figure 5C:
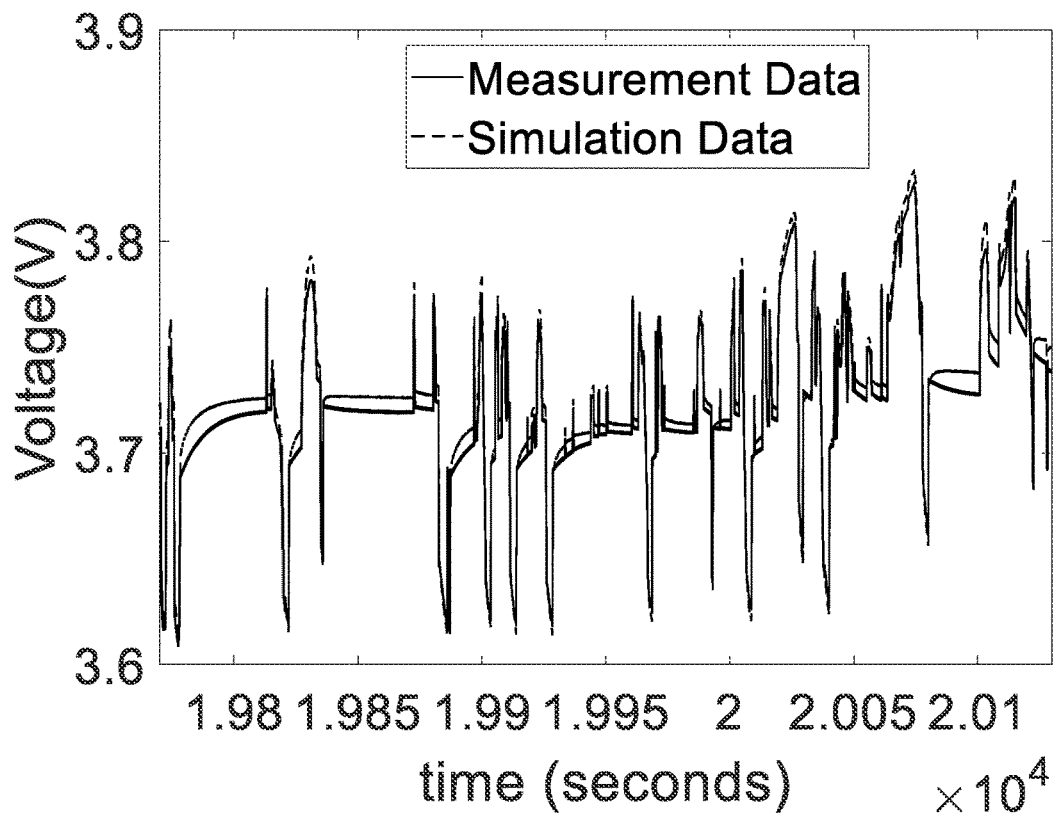
Figure 5D:
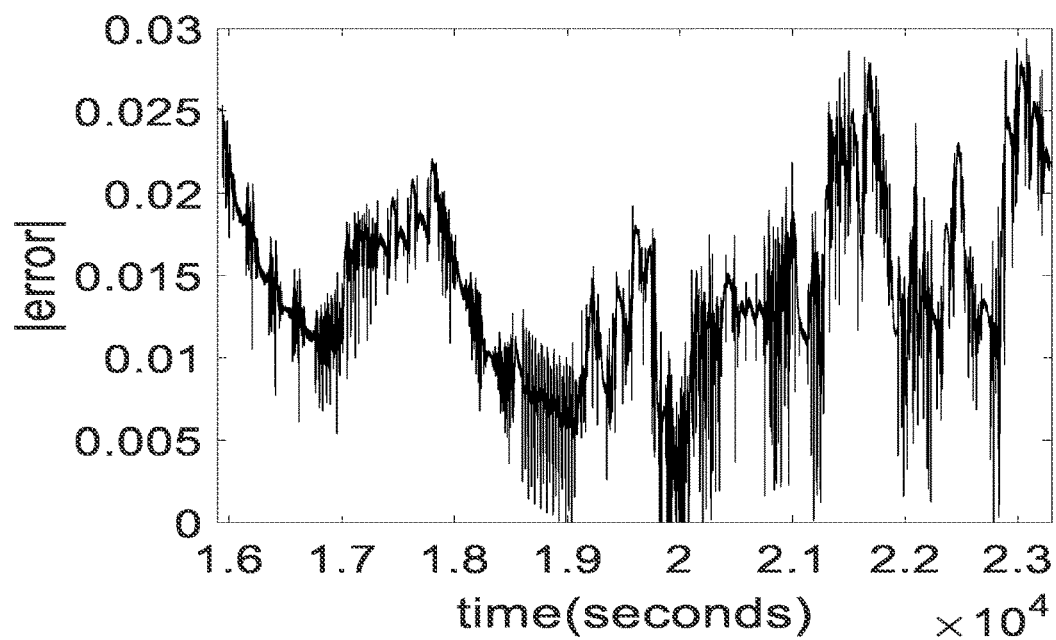

The above model parameter values are made into a table. A battery simulation model is established in MATLAB. Response values are assigned to the battery parameters by adopting a lookup table method. At room temperature T=20°, a load cycle condition of a hybrid electric vehicle is adopted for algorithm simulation and experimental verification. The load cycle condition refers to a typical condition of a heavy hybrid electric vehicle, which is similar to test conditions such as urban dynamometer driving schedule (UDDS) and new European driving cycle (NEDC). Through the statistics of actual conditions of a test vehicle in multiple typical suburban areas, common condition data, including urban, suburban, high-speed, cross-country, and other conditions, and covering the switching of internal combustion driving mode, pure electric driving mode, hybrid electric mode, idling power generation mode, and other working modes are extracted. The vehicle simulation software Cruse is used to simulate such driving cycle to obtain the load cycle condition battery. The current is as shown in FIG. 5A. In the case of full load of T=20° and SOC=70%, the verification result is as shown in FIG. 5B to FIG. 5D. The simulated voltage is the battery model output voltage obtained by the simulation under the load cycle condition current. In FIG. 5B is a comparison between a measured voltage and a simulated voltage, FIG. 5C is the comparison between the measured voltage and the simulated output voltage in a certain region after amplification, and FIG. 5D is an absolute error of the simulated voltage. It can be seen from FIG. 5A to FIG. 5D that although the conditions are complex, the battery is constantly charged and discharged and the charge-discharge rate is constantly changing, the simulated value of the battery terminal voltage may follow the experimental measured value well, which indicates the parameter value obtained by adopting the likelihood function for parameter estimation follows the actual parameter value. The absolute maximum error is less than 0.036 V, the mean absolute error (MAE) is 0.0084 V, and the root mean square error is 0.0149 V, so the precision is relatively high.

The identification of the third-order battery model parameters based on the likelihood function according to the disclosure can implement the estimation of the battery model parameters, is simple and effective, and has high precision.

It should be pointed out that according to the implementation requirements, each step/component described in the present application may be split into more steps/components, or two or more steps/components or partial operations of a step/component may be combined into a new step/component to implement the objectives of the disclosure.

Persons skilled in the art may easily understand that the above descriptions are only preferred embodiments of the disclosure and are not intended to limit the disclosure. Any modification, equivalent replacement, improvement, etc. made within the spirit and principle of the disclosure should be included in the protection scope of the disclosure.

What is claimed is:

1. A method for identifying third-order model parameters of a lithium battery based on a likelihood function, characterized by comprising the following steps executing by a processor:

Step (1) of establishing a third-order battery circuit of the lithium battery;

Step (2) of collecting an output voltage and a total battery current of the third-order battery circuit under different temperatures, different system-on-chips (SOCs), and charge-discharge currents;

Step (3) of adopting the likelihood function to construct an identification model; and Step (4) of substituting the collected output voltage and total battery current of the third-order battery circuit into the identification model to calculate the third-order battery circuit parameters;

wherein the third-order battery circuit comprises a battery (OCV), an ohmic resistor ($R_{ac}$), a charge transfer resistor ($R_{ct}$), a charge transfer capacitor ($C_{ct}$), a first diffused resistor ($R_{wb1}$), a first diffused capacitor ($C_{wb1}$), a second diffused resistor ($R_{wb2}$), and a second diffused capacitor ($C_{wb2}$), wherein a first terminal of the battery (OCV) is connected to a first terminal of the ohmic resistor ($R_{ac}$); a second terminal of the ohmic resistor ($R_{ac}$) is connected to a first terminal of the charge transfer resistor ($R_{ct}$) and a first terminal of the charge transfer capacitor ($C_{ct}$); after being connected, a second terminal of the charge transfer resistor ($R_{ct}$) and a second terminal of the charge transfer capacitor ($C_{ct}$) are connected to a first terminal of the first diffused resistor ($R_{wb1}$) and a first terminal of the first diffused capacitor ($C_{wb1}$); after being connected, a second terminal of the first diffused resistor ($R_{wb}$) and a second terminal of the first diffused capacitor ($C_{wb1}$) are connected to a first terminal of the second diffused resistor ($R_{wb2}$) and a first terminal of the second diffused capacitor ($C_{wb2}$); and after being connected, a second terminal of the second diffused resistor ($R_{wb2}$) and a second terminal of the second diffused capacitor ($C_{wb2}$) are connected to a second terminal of the battery (OCV).

2. The method according to claim 1, characterized in that Step (1) comprises:

a discretized battery state equation of the third-order battery circuit is:

$$\begin{cases} U_{ct}(k+1) = U_{ct}(k)*\exp(-T/\tau_{ct}) + I(k)R_{ct}*(1-\exp(-T/\tau_{ct})) \\ U_{wb1}(k+1) = U_{wb1}(k)*\exp(-T/\tau_{wb1}) + I(k)R_{wb1}*(1-\exp(-T/\tau_{wb1})) \\ U_{wb2}(k+1) = U_{wb2}(k)*\exp(-T/\tau_{wb2}) + I(k)R_{wb2}*(1-\exp(-T/\tau_{wb2})) \\ SOC(k+1) = SOC(k) - \dfrac{T*I(k)}{C} \end{cases}$$

where T is a sampling interval, k is a sampling time, I represents a total battery current, $U_{ct}$ represents a voltage of $R_{ct}C_{ct}$ network, $\tau_{ct}$ represents a time constant of $R_{ct}C_{ct}$ network, $U_{wb1}$ represents a voltage of $R_{wb1}C_{wb1}$ network, $\tau_{wb1}$ represents a time constant of $R_{wb1}C_{wb1}$ network, $U_{wb2}$ represents a voltage of $R_{wb2}C_{wb2}$ network, $\tau_{wb2}$ represents a time constant of $R_{wb2}C_{wb2}$ network, SOC represents a battery state of charge, C represents a battery capacity, and $R_{wb1}=3R_{wb2}$ and $\tau_{wb1}=\tau_{wb2}$; and a discretized predicted battery module terminal voltage of the third-order battery circuit is:

$$y_{k+1} = U_{ocv} - U_{ct}(k) - U_{wb1}(k) - U_{wb2}(k) - R_{ac}I(k)$$

where $y_{k+1}$ represents the predicted battery module terminal voltage, $U_{ocv}$, represents a battery open circuit voltage, and $R_{ac}$ represents an ohmic internal resistance.

3. The method according to claim 2, characterized in that Step (3) comprises:

Step (3.1) of performing an inverse Z-transformation after performing a Z-transformation on the battery state equation and the predicted battery module terminal voltage, so as to obtain:

$$U_d(k+3) = \theta_1 U_d(k+2) + \theta_2 U_d(k+1) + \theta_3 U_d(k) + \theta_4 I(k+3) + \theta_5 I(k+2) + \theta_6 I(k+1) + \theta_7 I(k) \text{ and } U_d(k) = (y_k - U_{OCV});$$

and

Step (3.2) of obtaining the identification model from $y_k = \theta^T \varphi(k)$, where $y_k$ is the predicted battery module terminal voltage, where: $\theta = [\theta_1\ \theta_2\ \theta_3\ \theta_4\ \theta_5\ \theta_6\ \theta_7]$, $\varphi(k) = U_d(k) = [U_d(k-1)\ U_d(k-2)\ U_d(k-3)\ I(k)\ I(k-1)\ I(k-2)\ I(k-3)]$, $\theta_1 = b_1 + b_3 + b_5$, $\theta_2 = -(b_1 b_3 + b_1 b_5 + b_3 b_5)$, $\theta_3 = b_1 b_3 b_5$, $\theta_4 = -R_{ac}$, $\theta_5 = R_{ac}(b_1 + b_3 + b_5) - (b_2 + b_4 + b_6)$, $\theta_6 = (b_3 + b_5)b_2 + (b_1 + b_5)b_4 + (b_1 + b_3)b_6 - R_{ac}(b_1 b_3 + b_1 b_5 + b_3 b_5)$, $\theta_7 = b_1 b_3 b_5 R_{ac} - b_3 b_5 b_2 - b_1 b_4 b_5 - b_1 b_3 b_6$, $b_1 = \exp(-T/\tau_{ct})$, $b_2 = R_{ct}*(1-\exp(-T/\tau_{ct}))$, $b_3 = \exp(-T/\tau_{wb1})$, $b_4 = R_{wb1}*(1-\exp(-T/\tau_{wb1}))$, and $b_5 = \exp(-T/\tau_{wb2})$.

4. The method according to claim 3, characterized in that Step (4) comprises:

Step (4.1) of taking a logarithm of a distribution function of the battery module terminal voltage to obtain:

$$\ln L(\theta) = \frac{-1}{2\sigma^2} \sum_{k=1}^{n} (y(k) - \theta^T \varphi(k))^2 - n \ln \sigma \sqrt{2\pi},$$

where n represents a total sample number of the collected output voltage and total battery current of the battery model, σ represents a variance, where $y(^k)$ is an actual measured battery module terminal voltage, and $\varphi(k) = U_d(k) = (y_k - U_{OCV})$;

Step (4.2) of setting a gradient operator as $$\nabla_\theta = \left[ \frac{\partial}{\partial \theta_1} \quad \frac{\partial}{\partial \theta_2} \quad \frac{\partial}{\partial \theta_3} \quad \frac{\partial}{\partial \theta_4} \quad \frac{\partial}{\partial \theta_5} \quad \frac{\partial}{\partial \theta_6} \quad \frac{\partial}{\partial \theta_7} \right],$$

substituting the collected output voltage and total battery current of the third-order battery circuit into an equation in Step (4.1), and $$\nabla_\theta \ln L(\theta) = \frac{-1}{\sigma^2} \sum_{k=1}^{n} (y(k) - \theta^T \varphi(k))^2 (-\varphi(k)) = 0$$

to calculate each element value of a matrix $\theta = [\theta_1 \ \theta_2 \ \theta_3 \ \theta_4 \ \theta_5 \ \theta_6 \ \theta_7]$; and Step (4.3) of inferring a magnitude of a third-order battery circuit parameter value according to a relationship between the third-order battery circuit parameter value and θ.

5. A system for identifying third-order model parameters of a lithium battery based on a likelihood function, characterized by comprising:

a battery model construction module, configured to establish a third-order battery circuit of a lithium battery;
a data collection module, configured to collect an output voltage and a total battery current of the third-order battery circuit under different temperatures, different SOCs, and charge-discharge currents;
an identification model construction module, configured to adopt the likelihood function to construct an identification model; and
a parameter determination module, configured to substitute the collected output voltage and total battery current of the third-order battery circuit into the identification model to calculate the third-order battery circuit parameters;
wherein the third-order battery circuit comprises a battery (OCV), an ohmic resistor ($R_{ac}$), a charge transfer resistor ($R_{ct}$), a charge transfer capacitor ($C_{ct}$), a first diffused resistor ($R_{wb1}$), a first diffused capacitor ($C_{wb1}$), a second diffused resistor ($R_{wb2}$), and a second diffused capacitor ($C_{wb2}$), wherein
a first terminal of the battery (OCV) is connected to a first terminal of the ohmic resistor ($R_{ac}$) a second terminal of the ohmic resistor ($R_{ac}$) is connected to a first terminal of the charge transfer resistor ($R_{ct}$) and a first terminal of the charge transfer capacitor ($C_{ct}$); after being connected, a second terminal of the charge transfer resistor ($R_{ct}$) and a second terminal of the charge transfer capacitor ($C_{ct}$) are connected to a first terminal of the first diffused resistor ($R_{wb1}$) and a first terminal of the first diffused capacitor ($C_{wb1}$); after being connected, a second terminal of the first diffused resistor ($R_{wb1}$) and a second terminal of the first diffused capacitor ($C_{wb1}$) are connected to a first terminal of the second diffused resistor ($R_{wb2}$) and a first terminal of the second diffused capacitor ($C_{wb2}$); and after being connected, a second terminal of the second diffused resistor ($R_{wb2}$) and a second terminal of the second diffused capacitor ($C_{wb2}$) are connected to a second terminal of the battery (OCV).

6. The system according to claim 5, characterized in that the battery model construction module comprises:

a battery state equation establishment module, configured to establish a discretized battery state equation of the third-order battery circuit:

$$\begin{cases} U_{ct}(k+1) = U_{ct}(k) * \exp(-T/\tau_{ct}) + I(k)R_{ct} * (1 - \exp(-T/\tau_{ct})) \\ U_{wb1}(k+1) = U_{wb1}(k) * \exp(-T/\tau_{wb1}) + I(k)R_{wb1} * (1 - \exp(-T/\tau_{wb1})) \\ U_{wb2}(k+1) = U_{wb2}(k) * \exp(-T/\tau_{wb2}) + I(k)R_{wb2} * (1 - \exp(-T/\tau_{wb2})) \\ SOC(k+1) = SOC(k) - \frac{T * I(k)}{C} \end{cases}$$

where T is a sampling interval, k is a sampling time, I represents a total battery current, $U_{ct}$ represents a voltage of $R_{ct}C_{ct}$ network, $\tau_{ct}$ represents a time constant of $R_{ct}C_{ct}$ network, $U_{wb1}$ represents a voltage of $R_{wb1}C_{wb1}$ network, $\tau_{wb1}$ represents a time constant of $R_{wb1}C_{wb1}$ network, $U_{wb2}$ represents a voltage of $R_{wb2}C_{wb2}$ network, $\tau_{wb2}$ represents a time constant of $R_{wb2}C_{wb2}$ network, SOC represents a battery state of charge, C represents a battery capacity, and $R_{wb1} = 3R_{wb2}$ and $\tau_{wb1} = 3\tau_{wb2}$; and a battery module terminal voltage acquisition module, configured to acquire a discretized predicted battery model terminal voltage of the third-order battery circuit:

$$y_{k+1} = U_{ocv} - U_{ct}(k) - U_{wb1}(k) - U_{wb2}(k) - R_{ac}I(k)$$

where $y_{k+1}$, represents the predicted battery module terminal voltage, $U_{ocv}$, represents a battery open circuit voltage, and $R_{ac}$ represents an ohmic internal resistance.

7. The system according to claim 6, characterized in that the identification model construction module comprises:

a transformation module, configured to perform an inverse Z-transformation after performing a Z-transformation on the battery state equation and the predicted battery module terminal voltage, so as to obtain:

$U_d(k+3) = \theta_1 U_d(k+2) + \theta_2 U_d(k+1) + \theta_3 U_d(k) + \theta_4 I(k+3) + \theta_5 I(k+2) + \theta_6 I(k+1) + \theta_7 I(k)$ and $U_d(k) = (y_k - U_{OCV})$;
and an identification model construction submodule, configured to obtain the identification model from $y_k = \theta^T \varphi(k)$, where $y_k$ is the predicted battery module terminal voltage, where $\theta = [\theta_1 \ \theta_2 \ \theta_3 \ \theta_4 \ \theta_5 \ \theta_6 \ \theta_7]$, $\varphi(k) = U_d(k) = [U_d(k-1) \ U_d(k-2) \ U_d(k-3) \ I(k) \ I(k-1) \ I(k-2) \ I(k-3)]$, $\theta_1 = b_1 + b_3 + b_5$, $\theta_2 = -(b_1b_3 + b_1b_5 + b_3b_5)$, $\theta_3 = b_1b_3b_5$, $\theta_4 = -R_{ac}$, $\theta_5 = R_{ac}(b_1 + b_3 + b_5) - (b_2 + b_4 + b_6)$, $\theta_6 = (b_3 + b_5)b_2 + (b_1 + b_5)b_4 + (b_1 + b_3)b_6 - R_{ac}(b_1b_3 + b_1b_5 + b_3b_5)$, $\theta_7 = b_1b_3b_5R_{ac} - b_3b_5b_2 - b_1b_4b_5 - b_1b_3b_6$, $b_1 = \exp(-T/\tau_{ct})$, $b_2 = R_{ct} * (1 - \exp(-T/\tau_{ct}))$, $b_3 = \exp(-T/\tau_{wb1})$, $b_4 = R_{wb1} * (1 - \exp(-T/\tau_{wb1}))$, and $b_5 = \exp(-T/\tau_{wb2})$.

8. The system according to claim 7, characterized in that the parameter determination module comprises:

a first calculation module, configured to take a logarithm of a distribution function of the battery module terminal voltage, so as to obtain:

$$\ln L(\theta) = \frac{-1}{2\sigma^2} \sum_{k=1}^{n} (y(k) - \theta^T \varphi(k))^2 - n \ln \sigma \sqrt{2\pi},$$

where n represents a total sample number of the collected output voltage and total battery current of the battery model, σ represents a variance, where $y(^k)$ is an actual measured battery module terminal voltage, and $\varphi(k)=U_d(k)=(y_k-U_{OCV})$;

a second calculation module, configured to set a gradient operator as $$\nabla_\theta = \left[ \frac{\partial}{\partial \theta_1} \quad \frac{\partial}{\partial \theta_2} \quad \frac{\partial}{\partial \theta_3} \quad \frac{\partial}{\partial \theta_4} \quad \frac{\partial}{\partial \theta_5} \quad \frac{\partial}{\partial \theta_6} \quad \frac{\partial}{\partial \theta_7} \right],$$

substitute the collected output voltage and total battery current of the third-order battery circuit into an equation of the first calculation module, and $$\nabla_\theta \ln L(\theta) = \frac{-1}{\sigma^2} \sum_{k=1}^{n} (y(k) - \theta^T \varphi(k))^2 (-\varphi(k)) = 0$$

to calculate each element value of a matrix $\theta=[\theta_1 \ \theta_2 \ \theta_3 \ \theta_4 \ \theta_5 \ \theta_6 \ \theta_7]$; and a parameter determination submodule, configured to infer a magnitude of a third-order battery circuit parameter value according to a relationship between the third-order battery circuit parameter value and θ.

* * * * *